(12) United States Patent
Banerjee et al.

(10) Patent No.: US 10,298,266 B2
(45) Date of Patent: May 21, 2019

(54) USING STORLET IN ERASURE CODE OBJECT STORAGE ARCHITECTURE FOR IMAGE PROCESSING

(71) Applicant: International Business Machines Corporation, Armonk, NY (US)

(72) Inventors: Pradipta K. Banerjee, Bangalore (IN); Sasikanth Eda, Vijayawada (IN); Sandeep R. Patil, Pune (IN); Subhojit Roy, Pune (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/183,045

(22) Filed: Jun. 15, 2016

(65) Prior Publication Data
US 2017/0366202 A1 Dec. 21, 2017

(51) Int. Cl.
| | | |
|---|---|---|
| *H03M 13/15* | (2006.01) | |
| *G06F 11/10* | (2006.01) | |
| *G06F 9/455* | (2018.01) | |
| *G06F 12/14* | (2006.01) | |
| *H03M 13/09* | (2006.01) | |
| *H03M 13/37* | (2006.01) | |
| *H03M 13/00* | (2006.01) | |

(52) U.S. Cl.
CPC ....... *H03M 13/154* (2013.01); *G06F 11/1076* (2013.01); *G06F 12/14* (2013.01); *H03M 13/093* (2013.01); *H03M 13/373* (2013.01); *H03M 13/611* (2013.01); *G06F 2009/45583* (2013.01)

(58) Field of Classification Search
CPC .............. H03M 13/154; G06F 11/1076; G06F 2009/45583
See application file for complete search history.

(56) References Cited

U.S. PATENT DOCUMENTS

| | | | |
|---|---|---|---|
| 3,327,288 A | 6/1967 | Webber | |
| 6,538,831 B1 * | 3/2003 | Ikeda | A61B 6/00 360/32 |
| 6,678,855 B1 * | 1/2004 | Gemmell | H03M 13/373 709/231 |

(Continued)

FOREIGN PATENT DOCUMENTS

WO 2013138587 A1 9/2013

OTHER PUBLICATIONS

Rouse et al.; "erasure coding"; TechTarget; first published in Nov. 2014; 4 pages; <http://searchstorage.techtarget.com/definition/erasure-coding>.

(Continued)

*Primary Examiner* — Joseph D Torres
(74) *Attorney, Agent, or Firm* — Richard A. Wilhelm

(57) ABSTRACT

Embodiments of the present invention provide methods, systems, and computer program products for using a storlet erasure code object storage architecture for image processing. In one embodiment, an object is received, the object being represented as erasure coded bits. A storage location associated with the erasure coded bits is identified. A virtual machine (VM) is invoked, where the VM is configured to compute a modification to the erasure coded bits and replace the original erasure coded bits with the modified erasure coded bits.

10 Claims, 5 Drawing Sheets

(56) References Cited

U.S. PATENT DOCUMENTS

| | | | | |
|---|---|---|---|---|
| 6,748,441 | B1* | 6/2004 | Gemmell | H04L 1/0041 709/231 |
| 8,726,129 | B1 | 5/2014 | Aguilera et al. | |
| 8,788,913 | B1* | 7/2014 | Xin | H03M 13/373 714/776 |
| 8,832,371 | B2* | 9/2014 | Uehara | G06F 3/0616 711/103 |
| 9,021,296 | B1* | 4/2015 | Kiselev | G06F 11/2082 714/6.23 |
| 9,690,657 | B2* | 6/2017 | Iliadis | G06F 11/1076 |
| 2015/0121169 | A1* | 4/2015 | Iliadis | G06F 11/1076 714/766 |

OTHER PUBLICATIONS

"Method to Improve Computation Performance in a Deduplication Enabled Globally Distributed Embedded Compute Infrastructure built Object Storage namespace"; An IP.com Prior Art Database Technical Disclosure; IP.com No. 000241148D; Mar. 31, 2015; pp. 1-6.

"Erasure Code Support"; OpenStack Cloud Software; Last updated on Apr. 5, 2016; 10 pages; <http://docs.openstack.org/developer/swift/overview_erasure_code.html>.

* cited by examiner

USING STORLET IN ERASURE CODE OBJECT STORAGE ARCHITECTURE FOR IMAGE PROCESSING

BACKGROUND OF THE INVENTION

The present invention relates generally to the field of object storage architecture, and more particularly to using storlet in an erasure code object storage architecture for image processing workload.

Traditional object storage architecture comprises two node groups: proxy nodes, which are used for distributing the load and request handling; and storage nodes which are responsible for writing to the disks/storage subsystems. Traditional object storage architecture serves as a storage unit, and in order for analysis of the data residing in these storage units (i.e., extracting meaningful information from raw data) an additional client or computing node is required.

Storlet architecture (i.e., embedded compute infrastructure built-in object storage) comprises a software engine present within the nodes. The end user must frame the computation algorithm and must deploy or pass it to this engine as a normal object PUT operation. Storlet architecture does not require any additional client or compute node to perform analysis of the data, but rather the proxy/storage node itself acts as a compute node and returns the results back to the user. Storlet architecture uses virtual machines (VM) (e.g., Linux Containers, Dockers, KVM, ZeroVM, etc.) deployed on the nodes to perform the computation tasks.

Erasure coding is a method of data protection in which data is broken into fragments, expanded, and encoded with redundant data pieces and stored across a set of different locations or storage media.

SUMMARY

Embodiments of the present invention provide methods, systems, and computer program products for using a storlet erasure code object storage architecture for image processing. In one embodiment, one or more computer processors receive an object, wherein the object is represented as a plurality of erasure coded bits. One or more computer processors identify a storage location associated with the plurality of erasure coded bits. One or more computer processors invoke a virtual machine (VM), wherein the VM is configured to compute a modification to the plurality of erasure coded bits and replace the plurality of erasure coded bits with the modified plurality of erasure coded bits.

DETAILED DESCRIPTION

With the use of erasure codes in object storage, a single object is split into segments and each segment of the object is erasure coded. The erasure coded segments of the object are spread across various nodes and written to a disk. Embodiments of the present invention recognize the following potential problems and/or potential areas for improvement with respect to the current state of the art: (i) in an erasure coded object storage architecture, presently, the storlet engine operation can become highly resource consuming (i.e., high computational resource use and longer execution times), as the engine needs to collect the erasure coded segments of the object from various disks, decode the segments to obtain the original object, perform a computation operation on the original object, encode the object, and store the encoded object back to the disk; and (ii) there is a lack of framework and middleware to help the storlet engine to understand the underlying erasure code schema of an object, the deployed computation algorithm requirement, and to help calculate new erasure codes of only the bits which need to be modified, according to the computation algorithm. Presently, the storlet engine can only be used in scale out object storage units which store full copies of objects at a single site. Embodiments of the present invention provide systems and methods to facilitate the efficient usage of a storlet engine to support erasure coded object storage architecture in image processing.

Figure 1:
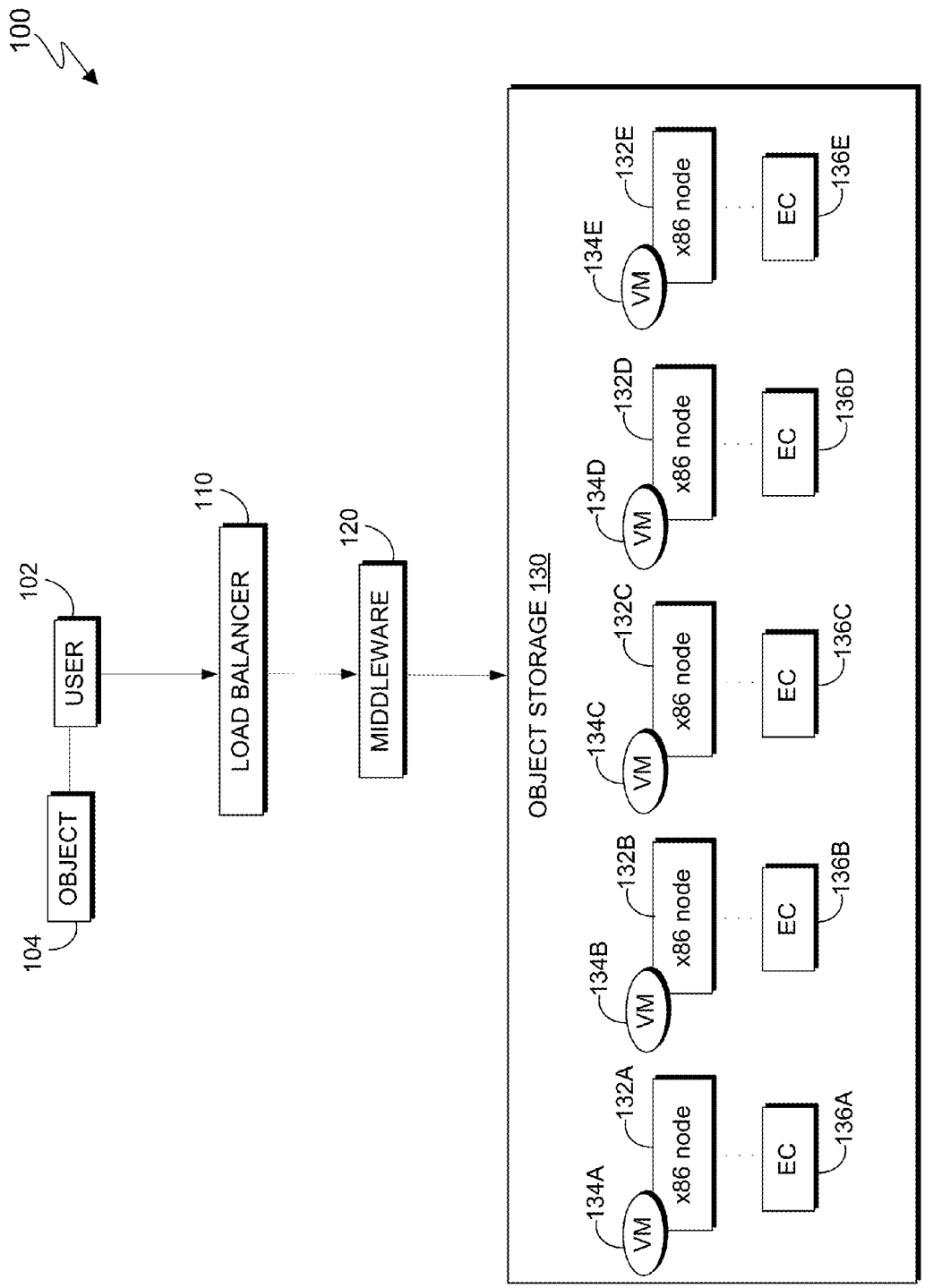
FIG. 1 depicts a functional block diagram illustrating an embedded computation engine based object storage architecture using erasure codes, in accordance with an embodiment of the present invention.

The present invention will now be described in detail with reference to the Figures. FIG. 1 depicts a functional block diagram illustrating a storlet (an embedded computation engine based object storage) architecture using erasure codes, generally designated "architecture" 100, in accordance with an embodiment of the present invention. Modifications to architecture 100 may be made by those skilled in the art without departing from the scope of the invention as recited by the claims. In an exemplary embodiment, architecture 100 includes load balancer 110, middleware 120, object storage 130, and nodes 132A-E.

User 102 deploys a computation algorithm for an object 104 to load balancer 110, using a PUT operation. Load balancer 110 is a physical machine, which determines to which node(s) to allocate requests.

Middleware 120 receives the computation task from load balancer 110 and spawns a virtual machine (i.e., a container) 134A-E on nodes 132A-E, respectively. In this exemplary embodiment, middleware 120 makes the determination as to which nodes 132A-E are selected for container creation and computation.

Object storage 130 can be any object storage system service known in the art, for example OpenStack Swift. In this exemplary embodiment, object storage 130 includes nodes 132A-E, which are examples of proxy and storage nodes, where object 104 is segmented and stored as erasure code (EC) fragments 136A-E on each of nodes 132A-E, respectively.

Erasure coding can be useful with large quantities of data and applications or systems which may need to tolerate failures, such as disk array systems, data grids, distributed storage applications, and object stores. Object-based cloud storage can also use erasure coding. Erasure coding enables data which has become corrupted during the disk storage process to be reconstructed by using information about the data that is stored at another location in the array.

Erasure coding creates a mathematical function to describe a set of numbers so they can be checked for accuracy and recovered if one is lost. The protection offered by erasure coding can be represented by equation 1:

$$n = k + m \quad \text{(Equation 1)}$$

where 'k' represents the original amount of data or symbols, 'm' represents the extra or redundant symbols, and 'n' represents the total number of symbols that are added to provide protection from failures.

Figure 2:
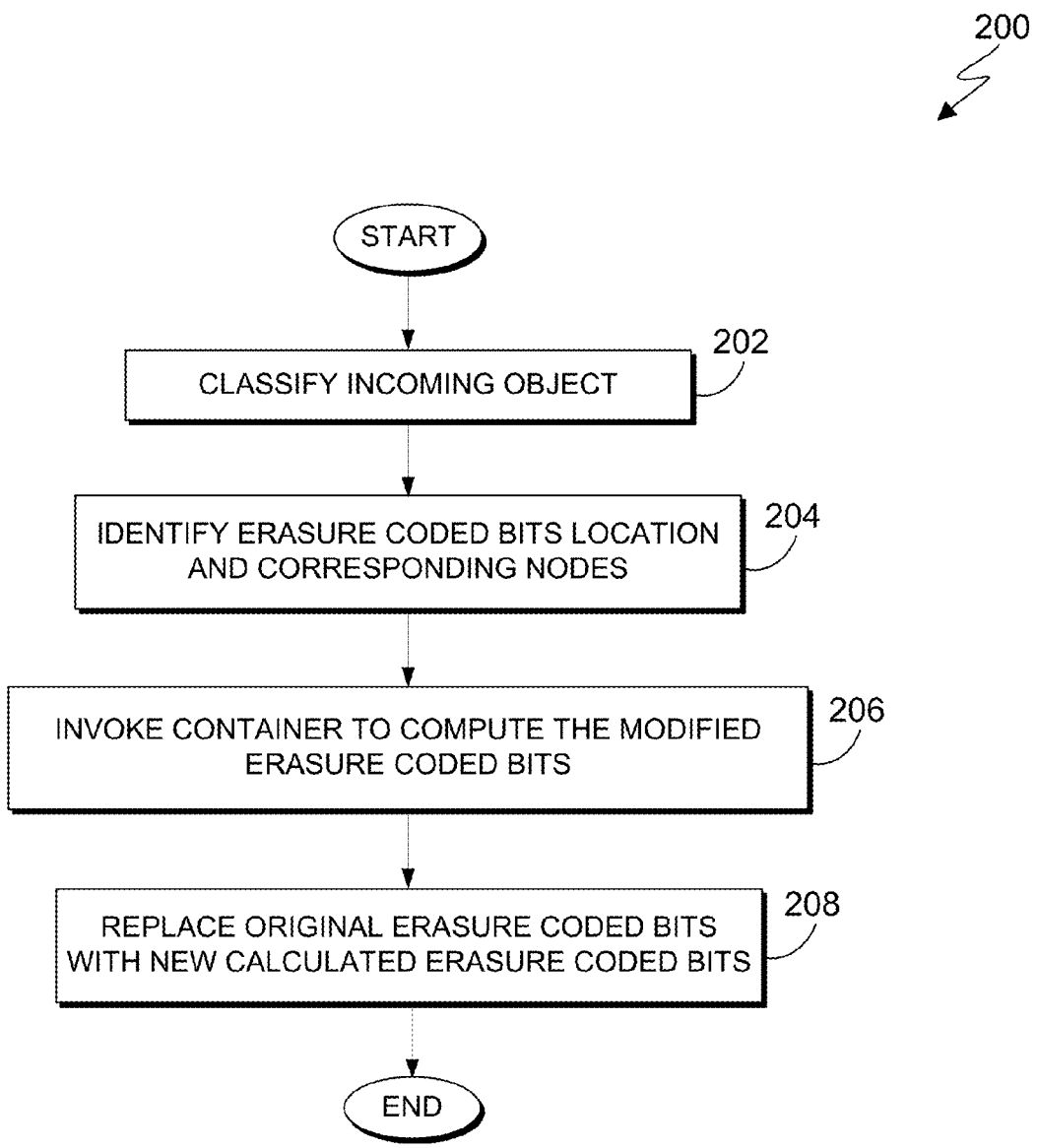
FIG. 2 depicts a flowchart illustrating operations for using a storlet engine to support an erasure coded object storage architecture, in accordance with an embodiment of the present invention.

FIG. 2 depicts a flowchart 200 illustrating operations for using a storlet engine to support an erasure coded object storage architecture, in accordance with an embodiment of the present invention.

Middleware 120 classifies an incoming object (operation 202). In this embodiment, middleware 120 classifies the incoming object according to a requirement of the preconfigured computation algorithm type (e.g., image analytics or text analytics). For example, computation_algorithm1= {'morph the x-ray, such that sex, age, name are hidden'} is the only computation algorithm meant for the storlet object storage architecture deployed in a private or industry-specific environment (this computation type is pre-programmed to the storage unit, whereas the dataset needed for this algorithm varies). For every new incoming object, middleware 120 identifies its classification (i.e., which computation algorithm may need this object in the future).

Middleware 120 identifies the location of the erasure coded bits, and their corresponding nodes (operation 204). In this embodiment, middleware 120, based on the identified class of the object, collects the storage location of the object erasure coded bits, and which node contains the erasure coded bits, corresponding, for example, to the name, sex, and age of the entire object (depicted in further detail in FIG. 3A).

Middleware 120 invokes a container to compute the modified erasure coded bits (operation 206). In this embodiment, middleware 120 invokes a container (i.e., virtual machine) on the node which contains a majority of the object fragments required for the computation algorithm. The invoked container reads the erasure coded object fragments, imports the erasure schema, and recalculates the erasure codes of the modification, based on the computation algorithm.

Middleware 120 replaces the original erasure coded bits with the new calculated erasure coded bits (operation 208). In this embodiment, middleware 120 replaces the original erasure coded bits with newly calculated erasure coded bits, such that while the user GET operation occurs, the proxy node can collect the object fragments corresponding to the object. In this case, the few, modified data fragments are replaced with the newly calculated bits, and the image is reconstructed with, for example, name, age, and sex, morphed.

Accordingly, by performing the operations of FIG. 2, image processing is facilitated at a faster rate when compared with traditional object storage through the usage of a middleware framework and algorithm which facilitates the storlet engine to support an erasure coded object storage architecture. By decoding only the required bits, performing a piece-wise computation operation using the partial erasure coded bits (i.e., only the required bits), encoding the modified bits, and replacing the original erasure coded bits with the newly calculated erasure coded bits, image processing rates can be increased.

Figure 3A:
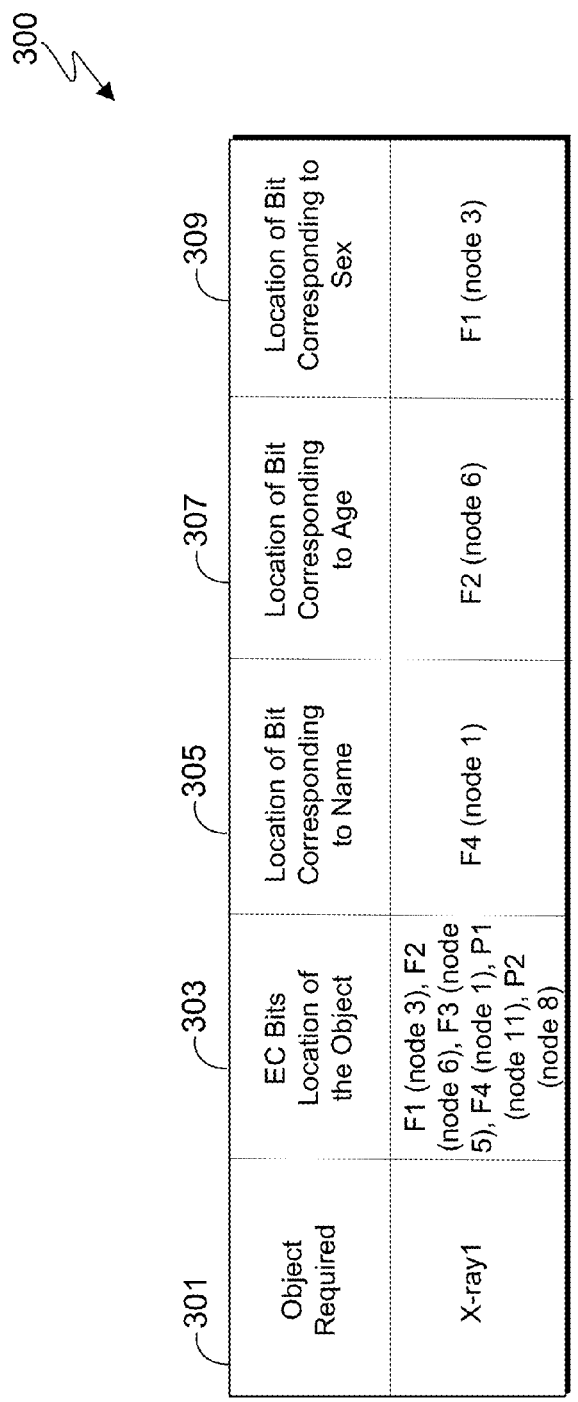
FIG. 3A depicts a table illustrating an example of the collected object erasure coded bits storage location and which node contains each erasure coded bit for an object, in accordance with an embodiment of the present invention.

FIG. 3A depicts a table 300 illustrating an example of the collected object erasure coded bits storage location and which node contains each erasure coded bit for an object, in accordance with an embodiment of the present invention.

As depicted in FIG. 3A, the object 301 to be stored is an x-ray image (i.e., 'X-ray1'), and the erasure coded bits' location of the object 303, as well as the nodes associated with the erasure coded bits' location, are listed. The location of the bit corresponding to the name 305, age 307, and sex 309, as well as the corresponding node are also listed. In this example, 'F' corresponds to object fragments (i.e., a portion of an object's data), and 'P' corresponds to parity fragments (i.e., the information required to reconstruct object data, if the fragments are lost). In this example, as the computational algorithm is to morph the data encoding the name, age, and sex, the storlet can be invoked (i.e., operation 206) on any of: node 1 (i.e., the location of the bit corresponding to name 305), node 6 (i.e., the location of the bit corresponding to age 307), and node 3 (i.e., the location of the bit corresponding to sex 309) for the object.

Figure 3B:
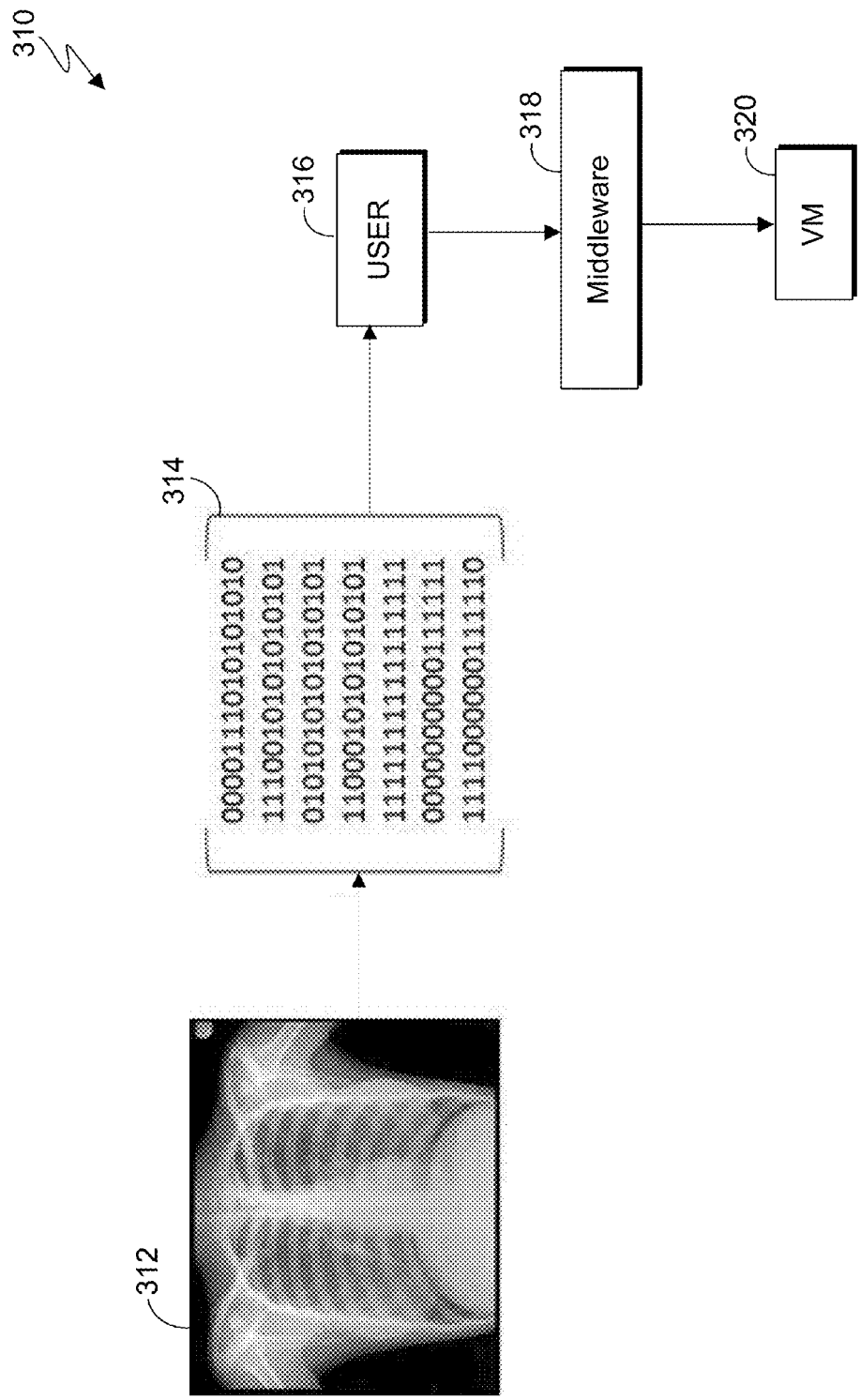
FIG. 3B depicts a block diagram illustrating an example of object storage in which fragments of the object are encoded and decoded, in accordance with an embodiment of the present invention.

FIG. 3B depicts a block diagram 310 illustrating an example flow of an object storage in which fragments of the object are encoded and decoded, in accordance with an embodiment of the present invention.

As depicted, the object 312 to be stored is an x-ray, and includes associated information "Name: John", "Age: 26", and "Sex: Male". Erasure coded bits 314 corresponding to object 312 are stored on a disk. Erasure coded bits 314 of object 312 are spread across various nodes, configured according to a policy. A user 316 may deploy a computational algorithm of middleware 318 to morph the name, age, and sex data associated with object 312. The computational algorithm keeps track of the location of the erasure coded bits and which bits are required for a particular computational algorithm (i.e., operation 204). Also, the equivalent erasure coded bits which correspond to a required modification are computed. Middleware 318 then sends the details of the erasure coded bits and invokes a virtual machine 320 on the corresponding storage node (i.e., operation 206). The storage node collects the erasure coded bits required for the morphing and replaces the original erasure coded bits 314 with the newly calculated erasure coded bits (i.e., operation 208).

For example, the age, name, and sex details may be blurred with '000' (i.e., the identifying binary information is removed/changed to hide the information), and virtual machine 320 calculates the new erasure coded bits of the modifications based on the imported schema, which can result in '101'. This can involve a change in data fragments, as well as in parity fragments.

Figure 4:
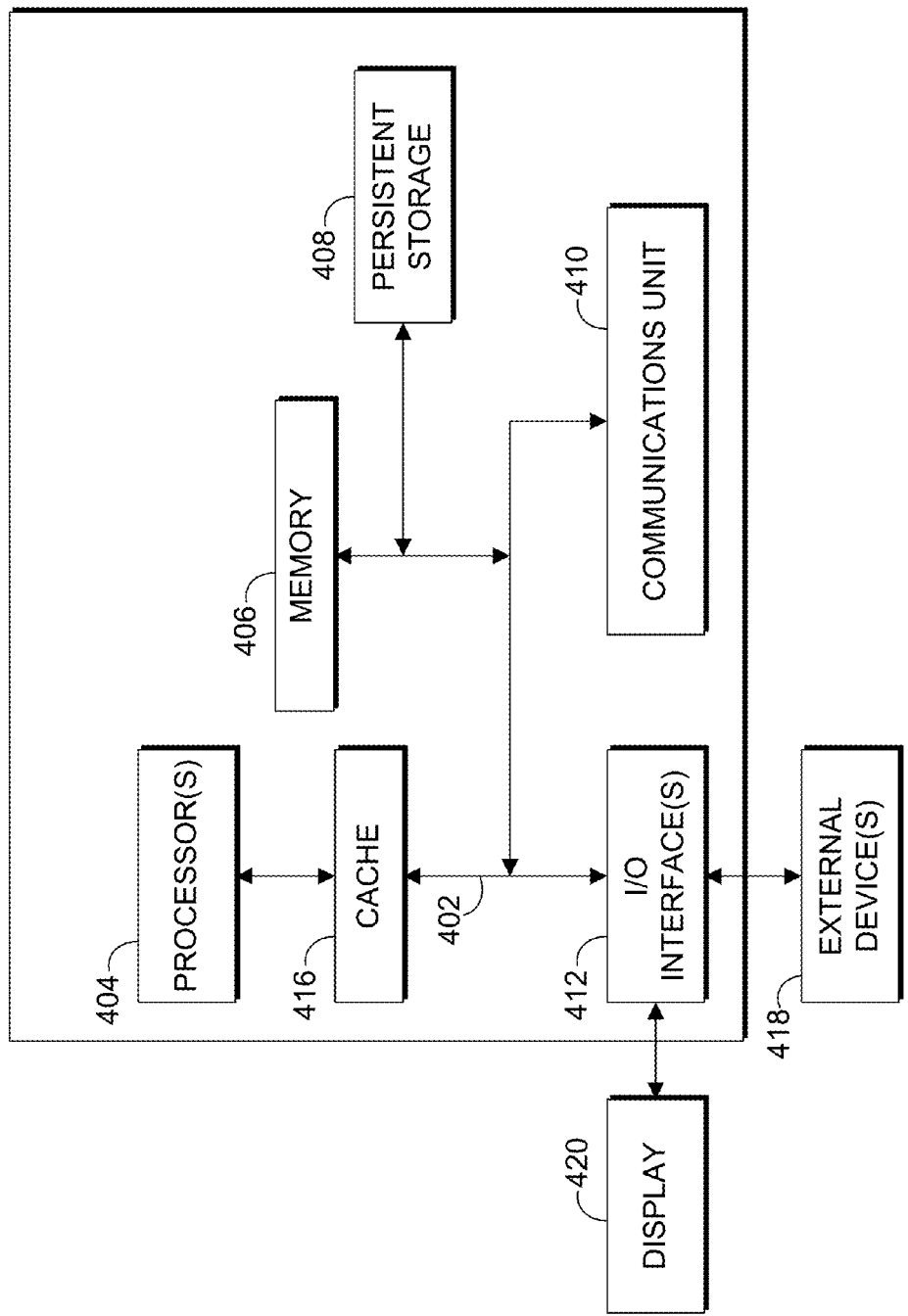
FIG. 4 depicts a block diagram of components of a computing device, in accordance with an illustrative embodiment of the present invention.

FIG. 4 is a block diagram of internal and external components of a computing device, generally designated 400, which is representative of the computing devices of FIG. 1, in accordance with an embodiment of the present invention. It should be appreciated that FIG. 4 provides only an illustration of one implementation and does not imply any limitations with regard to the environments in which different embodiments may be implemented. Many modifications to the depicted environment may be made.

Computing device 400 includes communications fabric 402, which provides communications between computer processor(s) 404, memory 406, cache 416, persistent storage 408, communications unit 410, and input/output (I/O) interface(s) 412. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses.

Memory 406 and persistent storage 408 are computer-readable storage media. In this embodiment, memory 406 includes random access memory (RAM). In general, memory 406 can include any suitable volatile or non-volatile computer readable storage media. Cache 416 is a fast memory that enhances the performance of processors 404 by holding recently accessed data, and data near recently accessed data, from memory 406.

Program instructions and data used to practice embodiments of the present invention may be stored in persistent storage 408 and in memory 406 for execution by one or more of the respective processors 404 via cache 416. In an embodiment, persistent storage 408 includes a magnetic hard disk drive. Alternatively, or in addition to a magnetic hard disk drive, persistent storage 408 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer readable storage medium that is also part of persistent storage 408.

Communications unit 410, in these examples, provides for communications with other data processing systems or devices, including resources of a network. In these examples, communications unit 410 includes one or more network interface cards. Communications unit 410 may provide communications through the use of either or both physical and wireless communications links. Program instructions and data used to practice embodiments of the present invention may be downloaded to persistent storage 408 through communications unit 410.

I/O interface(s) 412 allows for input and output of data with other devices that may be connected to computing device 400. For example, I/O interface 412 may provide a connection to external devices 418 such as a keyboard, keypad, a touch screen, and/or some other suitable input device. External devices 418 can also include portable computer-readable storage media such as, for example, thumb drives, portable optical or magnetic disks, and memory cards. Software and data used to practice embodiments of the present invention (e.g., software and data) can be stored on such portable computer-readable storage media and can be loaded onto persistent storage 408 via I/O interface(s) 412. I/O interface(s) 412 also connect to a display 420.

Display 420 provides a mechanism to display data to a user and may be, for example, a computer monitor, or a television screen.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein

What is claimed is:

1. A method comprising:
receiving, by a middleware, an object represented as a plurality of erasure coded bits and a preconfigured computation algorithm, wherein the middleware and a plurality of nodes run on one or more computer processors, wherein the one or more of the plurality of nodes each comprise a virtual machine (VM);
classifying the object, by the middleware, using the preconfigured computation algorithm, wherein the preconfigured computation algorithm classifies the object based on classification requirements defined by a type of preconfigured computation algorithm;
identifying, by the middleware, a storage location associated with at least one of the plurality of erasure coded bits of the object, the storage location being one or more of the plurality of nodes;
invoking, by the middleware, the VM on at least one of the plurality of nodes corresponding to the identified storage location, wherein the VM is configured to read at least one of the plurality of erasure encoded bits and compute a modification to the at least one of the plurality of erasure coded bits using the preconfigured computation algorithm, wherein the modification comprises changing a set of identifying information associated with the object; and
replacing, by the middleware, the at least one of the plurality of erasure coded bits with the modified at least one of the plurality of erasure coded bits.

2. The method of claim 1, wherein replacing the plurality of erasure coded bits with the modified plurality of erasure coded bits, further comprises:
reconstructing the object, by the middleware, using the changed set of identifying information associated with the object.

3. The method of claim 2, wherein the reconstructed object is an image, and wherein the changed set of identifying information associated with the object comprises: a name, an age, and a sex.

4. The method according to claim 1, wherein the preconfigured computation algorithm comprises either of: an image analytics algorithm or a text analytics algorithm.

5. A non-transitory computer readable storage medium, the non-transitory storage medium having computer executable instructions stored thereon, the program instructions comprising:
program instructions to receive, by a middleware, an object represented as a plurality of erasure coded bits and a preconfigured computation algorithm, wherein the middleware and a plurality of nodes run on one or more computer processors, wherein the one or more of the plurality of nodes each comprise a virtual machine (VM);
program instructions to classify the object, by the middleware, using the preconfigured computation algorithm, wherein the preconfigured computation algorithm classifies the object based on classification requirements defined by a type of preconfigured computation algorithm;
program instructions to identify, by the middleware, a storage location associated with at least one of the plurality of erasure coded bits of the object, the storage location being one or more of the plurality of nodes;
program instructions to invoke, by the middleware, the VM on at least one of the plurality of nodes corresponding to the identified storage location, wherein the VM is configured to read at least one of the plurality of erasure encoded bits and compute a modification to the at least one of the plurality of erasure coded bits using the preconfigured computation algorithm, wherein the modification comprises changing a set of identifying information associated with the object; and program instructions to replace by the middleware, the at least one of the plurality of erasure coded bits with the modified at least one of the plurality of erasure coded bits.

6. The non-transitory computer readable storage medium of claim 5, wherein the program instructions to replace the plurality of erasure coded bits with the modified plurality of erasure coded bits, further comprise:

program instructions to reconstruct the object, by the middleware, using the changed set of identifying information associated with the object.

7. The non-transitory computer readable storage medium of claim 6, wherein the reconstructed object is an image, and wherein the changed set of identifying information associated with the object comprises: a name, an age, and a sex.

8. A computer system comprising:

one or more computer processors;

one or more computer readable storage media;

program instructions stored on the computer readable storage media for execution by at least one of the one or more processors, the program instructions comprising:

program instructions to receive, by a middleware, an object represented as a plurality of erasure coded bits and a preconfigured computation algorithm, wherein the middleware and a plurality of nodes run on one or more computer processors, wherein the one or more of the plurality of nodes each comprise a virtual machine (VM);

program instructions to classify the object, by the middleware, using the preconfigured computation algorithm, wherein the preconfigured computation algorithm classifies the object based on classification requirements defined by a type of preconfigured computation algorithm;

program instructions to identify, by the middleware, a storage location associated with at least one of the plurality of erasure coded bits of the object, the storage location being one or more of the plurality of nodes;

program instructions to invoke, by the middleware, the VM on at least one of the plurality of nodes corresponding to the identified storage location, wherein the VM is configured to read at least one of the plurality of erasure encoded bits and compute a modification to the at least one of the plurality of erasure coded bits using the preconfigured computation algorithm, wherein the modification-comprises changing a set of identifying information associated with the object; and program instructions to replace, by the middleware, the at least one of the plurality of erasure coded bits with the modified at least one of the plurality of erasure coded bits.

9. The computer system of claim 8, wherein the program instructions to replace the plurality of erasure coded bits with the modified plurality of erasure coded bits, further comprise:

program instructions to reconstruct the object, by the middleware, using the changed set of identifying information associated with the object.

10. The computer system of claim 9, wherein the reconstructed object is an image, and wherein the changed set of identifying information associated with the object comprises: a name, an age, and a sex.

* * * * *